United States Patent
Van Den Boom et al.

(10) Patent No.: US 6,501,401 B2
(45) Date of Patent: Dec. 31, 2002

(54) MEANS FOR COMPENSATING A DATA-DEPENDENT SUPPLY CURRENT IN AN ELECTRONIC CIRCUIT

(75) Inventors: Jeroen Michiel Van Den Boom, Eindhoven (NL); Jan Roelof Westra, Amstelveen (NL); Quino Alexander Sandifort, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/962,649

(22) Filed: Sep. 25, 2001

(65) Prior Publication Data

US 2002/0047792 A1 Apr. 25, 2002

(30) Foreign Application Priority Data

Sep. 27, 2000  (EP) .............................................. 00203347

(51) Int. Cl.$^7$ ................................................ H03M 1/06
(52) U.S. Cl. ...................... 341/118; 341/120; 341/144; 341/153; 341/154
(58) Field of Search ................................ 341/118, 144, 341/153, 154, 120; 323/312, 313

(56) References Cited

U.S. PATENT DOCUMENTS

| | | | | |
|---|---|---|---|---|
| 4,381,497 A | * | 4/1983 | Lillis et al. .................. | 323/315 |
| 5,111,205 A | * | 5/1992 | Morlon ........................ | 341/118 |
| 5,134,398 A | * | 7/1992 | Yasutake et al. ............. | 341/119 |
| 5,541,597 A | * | 7/1996 | Chi-Mao ..................... | 341/118 |
| 5,568,146 A | * | 10/1996 | Park ............................ | 341/118 |
| 5,612,696 A | * | 3/1997 | Kim ............................ | 341/136 |
| 5,940,020 A | * | 8/1999 | Ho ............................. | 341/145 |
| 6,317,069 B1 | * | 11/2001 | Male et al. .................. | 341/145 |

* cited by examiner

*Primary Examiner*—Michael Tokar
*Assistant Examiner*—Linh Van Nguyen
(74) *Attorney, Agent, or Firm*—Aaron Waxler

(57) ABSTRACT

Electronic circuitry comprising a data processing circuit for processing a digital signal (DS), such as a digital to analog converter (DAC), and a current compensation circuit (CMP). Both the digital to analog converter (DAC) and the current compensation circuit (CMP) are powered by a single power supply ($U_1$). The current taken from the power supply ($U_1$) by the digital to analog converter (DAC) is normally dependent on the digital input signal (DS). This would lead to distortion since the loss-resistances ($R_{11}$, $R_{12}$) which are always present in series with the power supply ($U_1$) then feed a data-dependent supply voltage ($U_2$) to the digital to analog converter (DAC). This problem is overcome by the addition of the current compensation circuit (CMP) which is coupled for receiving the digital signal (DS). The current compensation circuit (CMP) is arranged in such a way that the sum of the data-dependent current drawn by the digital to analog converter (DAC) and the data-dependent current drawn by the compensation circuit (CMP) is substantially independent of the data.

7 Claims, 3 Drawing Sheets

MEANS FOR COMPENSATING A DATA-DEPENDENT SUPPLY CURRENT IN AN ELECTRONIC CIRCUIT

FIELD OF THE INVENTION

The invention relates to an electronic circuit comprising a data processing circuit for processing a digital signal, which data processing circuit is coupled between a first supply connection terminal and a second supply connection terminal for receiving a supply voltage.

BACKGROUND OF THE INVENTION

Such an electronic circuit is known from the general prior art. In general, the current consumed by the data processing circuit is dependent on the data content of the digital signal. A certain wiring impedance (ohmic resistance and self-inductance) is always present in series with the supply lines of the data processing circuit. Owing to the presence of this wiring impedance, and owing to the fact that the current consumed by the data processing circuit is dependent on the data content of the digital signal, the data processing circuit is supplied with a voltage which has a data-dependent component. The so-called Power Supply Rejection Ratio of an electronic circuit is always finite, so that distortion of signals will arise in the data processing circuit in dependence on the value of the Power Supply Rejection Ratio. In addition, an undesirable signal crosstalk may arise to other parts of the electronic circuit. Efforts are made in practice to limit this signal distortion and signal crosstalk by designing the data processing circuit such that the Power Supply Rejection Ratio is a maximum. Efforts are further made to minimize the wiring impedance present. These measures, however, are not always sufficient. Moreover, these measures may have the result that the implementation of the data processing circuit is very complicated. It is also possible that such an implementation, in which a high Power Supply Rejection Ratio is sought after, will have a negative impact on other quality aspects.

SUMMARY OF THE INVENTION

It is accordingly an object of the invention to provide an electronic circuit with a data processing circuit which does not have the above disadvantages, or at least to a very low degree.

According to the invention, the electronic circuit mentioned in the opening paragraph is for this purpose characterized in that the electronic circuit comprises a current compensation circuit which is coupled between the first supply connection terminal and the second supply connection terminal for receiving the supply voltage, which current compensation circuit in the operational state is controlled from the digital signal such that the sum of the current consumption of the data processing circuit and the current consumption of the current compensation circuit is substantially independent of the data content of the digital signal.

Both the data processing circuits and the current compensation circuit have a current consumption which is data-dependent. The data-dependent component of the current consumption of the current compensation circuit has the same magnitude as the data-dependent component of the current consumption of the data processing circuit. The two said current components, however, are in counter-phase. Since the supply connection points of the data processing circuit and of the current compensation circuit are interconnected by means of a very short wiring, there will be substantially no data-dependent current through the wiring impedances. This is because the data-dependent component of the data processing circuit and the data-dependent component of the current compensation circuit compensate one another. The result of this is that the data processing circuit is supplied with a supply voltage which is substantially independent of the data content of the digital signal. Signal distortion and signal crosstalk are thus avoided, even in the case of a low Power Supply Rejection Ratio of the data processing circuit.

An example of an electronic data processing circuit is a so-called DA converter which converts the digital signal into an analog signal.

Advantageous embodiments of current compensation circuits for use in the electronic circuit according to the invention are specified in claims 3 to 6. An advantageous embodiment of a DA converter for use in an electronic circuit according to the invention is specified in claim 7.

BRIEF DESCRIPTION OF THE DRAWING

The invention will be explained in more detail with reference to the accompanying drawing, in which.

Equivalent components or elements have been given the same reference symbols in these Figures.

DETAILED DESCRIPTION OF THE PRIMARY EMBODIMENT

Figure 1:
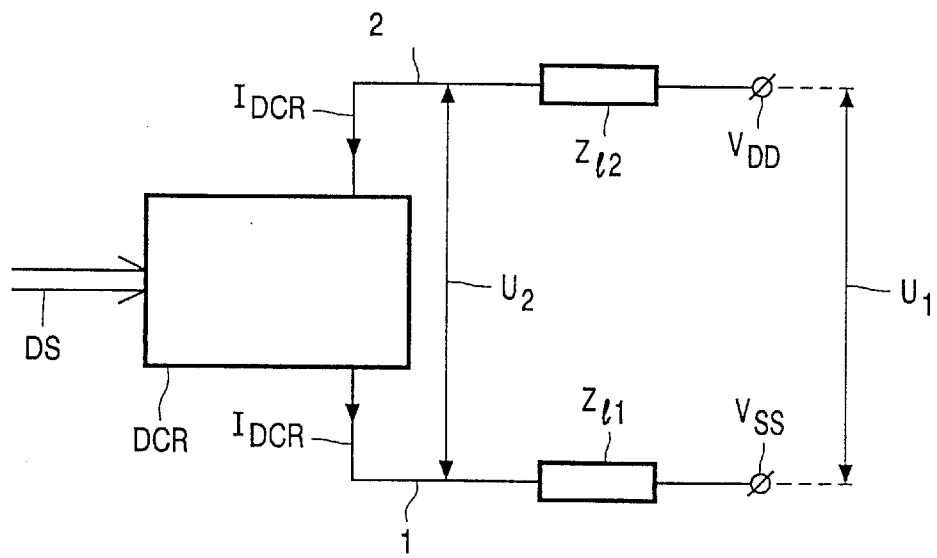
FIG. 1 shows a known electronic circuit with a data processing circuit.

FIG. 1 shows a known electronic circuit with a data processing circuit DCR. A first supply connection point 1 of the data processing circuit DCR is connected to a first supply connection terminal $V_{SS}$ of the electronic circuit. A second supply connection point 2 of the data processing circuit DCR is connected to a second supply connection terminal $V_{DD}$ of the electronic circuit, A supply voltage $U_1$ is connected between the first supply connection terminal $V_{SS}$ and the second supply connection terminal $V_{DD}$. Parasitic wiring impedances between the connection point 1 and the first supply connection terminal $V_{SS}$ and between the connection point 2 and the second supply connection terminal $V_{DD}$ are referenced $Z_{11}$ and $Z_{12}$, respectively. The data processing circuit DCR receives a digital input signal DS. The current consumption $I_{DCR}$ of the data processing circuit DCR in general comprises a component which is dependent on the digital input signal DS. The presence of the parasitic wiring impedances $Z_{11}$ and $Z_{12}$ thus gives rise to an effective supply voltage $U_2$ with a component which is dependent on the digital input signal DS. Now if the data processing circuit DCR has an insufficiently high Power Supply Rejection Ratio, a signal distortion will arise owing to the data-dependent component in the effective supply voltage $U_2$, and possibly also signal crosstalk to other parts of the electronic circuit.

Figure 2:
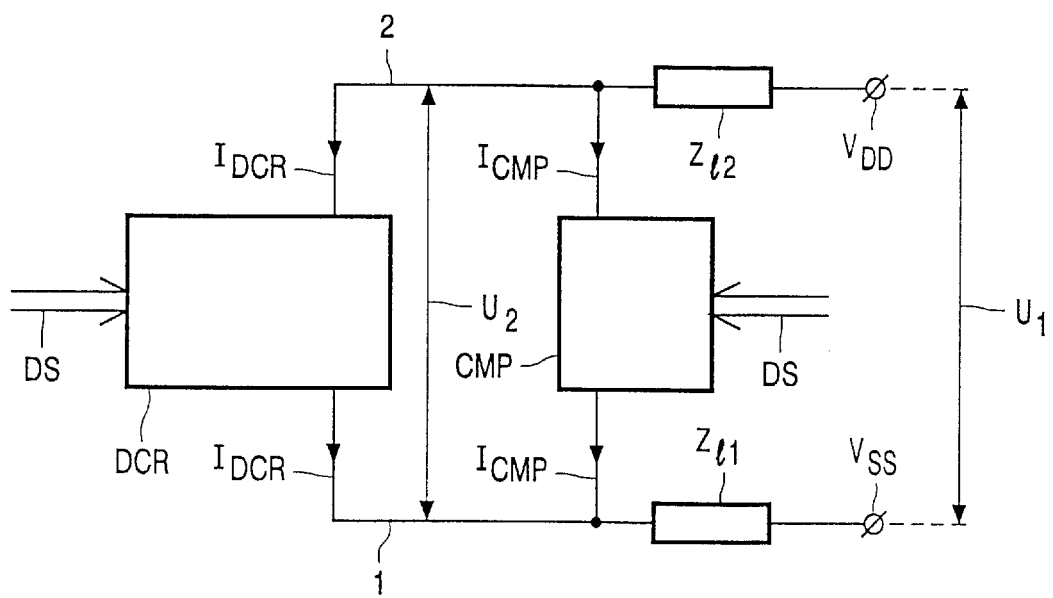
FIG. 2 is a circuit diagram of an electronic circuit according to the invention.

FIG. 2 shows an electronic circuit according to the invention with a data processing circuit DCR as shown in FIG. 1, with added thereto a current compensation circuit CMP. The digital signal DS is supplied not only to the data processing circuit DCR but also to the current compensation circuit CMP. The supply lines of the current compensation circuit CMP are not connected to the first supply connection terminal $V_{SS}$ and the second supply connection terminal $V_{DD}$, but are connected to the first supply connection point 1 and the second supply connection point 2, respectively. The current consumption of the current compensation circuit CMP is referenced $I_{CMP}$. The value of $I_{CMP}$ preferably lies much lower than the value of $I_{DCR}$, so that the total current consumption of the electronic circuit is not appreciably increased. The current compensation circuit CMP is designed such that the current consumption $I_{CMP}$ comprises a data-dependent component which is of the same magnitude as the data-dependent component of the current consumption $I_{DCR}$ of the data processing circuit DCR, but in opposite phase. As a result, the effective supply voltage $U_2$ contains substantially no data-dependent component.

The electronic circuit of FIG. 2 is now explained in more detail with reference to FIGS. 3, 4, and 5. FIG. 5 shows a DA converter DAC as an example of a data processing circuit DCR. The DA converter DAC comprises switching means $S_{CNV}$ and conversion resistors $R_{CNV0}$ to $R_{CNVn}$. The switching means $S_{CNV}$ comprise switches which are controlled by the digital signals DS, which are referenced $a_0$ to $a_n$. The DA converter DAC supplies an analog output signal $U_{OUT}$ to an output terminal OUT of the DA converter DAC. The conversion resistors are connected either between the first connection point 1 and the output terminal OUT or between the second supply connection point 2 and the output terminal OUT in dependence on the logic values of the signals $a_0$ to $a_n$. FIG. 5 shows the situation, by way of example, in which the conversion resistors $R_{CNV0}$ and $R_{CNV1}$ are connected between the second supply connection point 2 and the output terminal OUT. The current consumption $I_{DCR}$ of the DA converter DAC is a minimum when all conversion resistors $R_{CNV0}$ to $R_{CNVn}$ are connected either between the first supply connection point 1 and the output terminal OUT or between the second supply connection point 2 and the output terminal OUT. The current consumption $I_{DCR}$ is greater in all other cases. The current consumption $I_{DCR}$ is a maximum when an equal number of conversion resistors is connected between the first supply connection point 1 and the output terminal OUT and between the second supply connection point 2 and the output terminal OUT. All this is subject to the assumption that all conversion resistors have substantially the same value. The current consumption $I_{DCR}$ is accordingly dependent on the value of the digital signal DS. FIG. 4 shows an example of a current compensation circuit CMP which in this example comprises three compensation resistors which are referenced $R_{CMP1}$ to $R_{CMP3}$. The current compensation circuit CMP further comprises switching means $S_{CMP}$ which are controlled by the digital signal DS. Depending on the digital signal DS, a number of compensation resistors are or are not connected between the first supply connection point 1 and the second supply connection point 2. It will be obvious that the current consumption $I_{CMP}$ depends on the digital signal DS. Given a correct mutual dimensioning of the DA converter DAC and the current compensation circuit CMP, therefore, the sum of the current consumption values $I_{DCR}$ and $I_{CMP}$ will be constant.

To clarify the manner of dimensioning, the following assumptions will now be made. The output terminal OUT is unloaded, the number of conversion resistors of FIG. 5 is equal to 4 and the number of compensation resistors of FIG. 4 is equal to 4, the supply voltage is 3 volts, the value of the conversion resistors is 30 kΩ, and the value of the compensation resistors is 120 kΩ. Two situations will now be discussed.

In situation 1, two conversion resistors are connected between the first supply connection point 1 and the output terminal OUT, and two conversion resistors are connected between the second supply connection point 2 and the output terminal OUT. The output voltage $U_{OUT}$ is equal to 1.5 volts. The total resistance connected between the first supply connection point 1 and the second supply connection point 2 is equal to 30 kΩ. The current consumption $I_{DCR}$ is 100 μA. Three compensation resistors with a value of 120 kΩ each are also connected in the current compensation circuit CMP between the first supply connection point 1 and the second supply connection point 2. This makes the current consumption $I_{CMP}$ equal to 75 μA. The sum of the current consumption values $I_{DCR}$ and $I_{CMP}$ is equal to 175 μA as a result.

In situation 2, one conversion resistor is connected between the second supply connection point 2 and the output terminal OUT, and three conversion resistors are connected between the first supply connection point 1 and the output terminal OUT. The output voltage $U_{OUT}$ is equal to 0.75 volt. The total resistance between the first supply connection point 1 and the second supply connection point 2 of the DA converter DAC is equal to 40 kΩ. This makes the current consumption $I_{DCR}$ equal to 75 μA. At the same time, four compensation resistors of 120 kΩ are connected in the current compensation circuit CMP between the first supply connection point 1 and the second supply connection point 2. As a result, the current consumption $I_{CMP}$ is equal to 100 μA. The total current consumption is accordingly equal to 175 μA.

It will be obvious from the above that the sum of the current consumption values $I_{DCR}$ and $I_{CMP}$ is constant, and is equal to 175 μA in this example.

Figure 3:
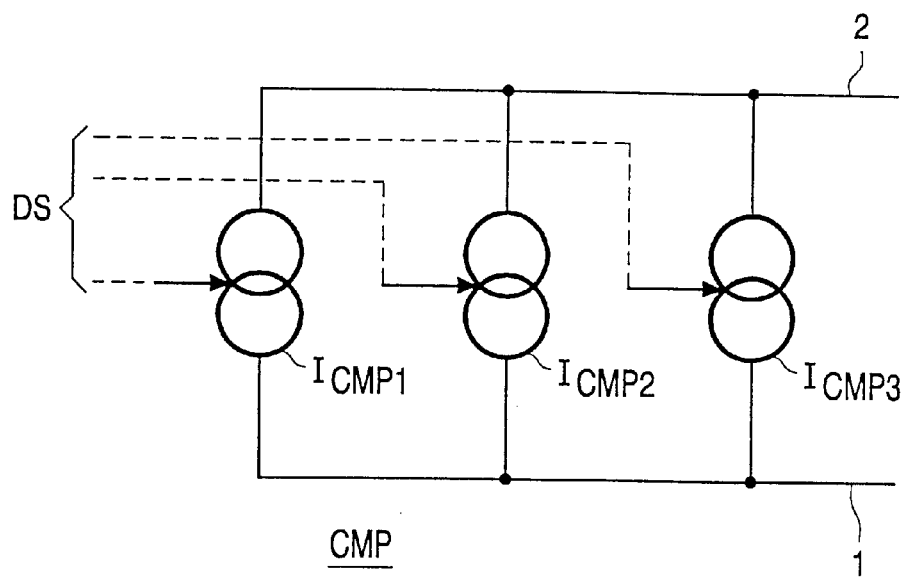
FIG. 3 is a circuit diagram of a first embodiment of a current compensation circuit for use in the electronic circuit of FIG. 2.
Figure 4:
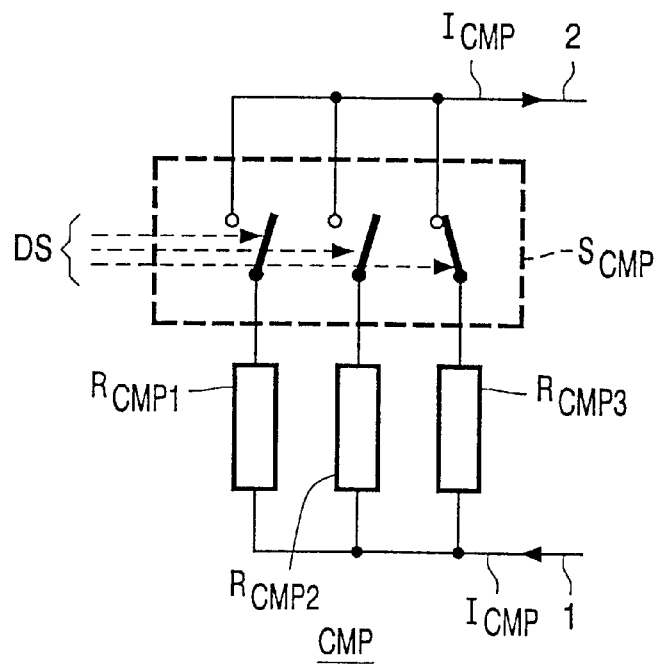
FIG. 4 is a circuit diagram of a second embodiment of a current compensation circuit for use in the electronic circuit of FIG. 2.
Figure 5:
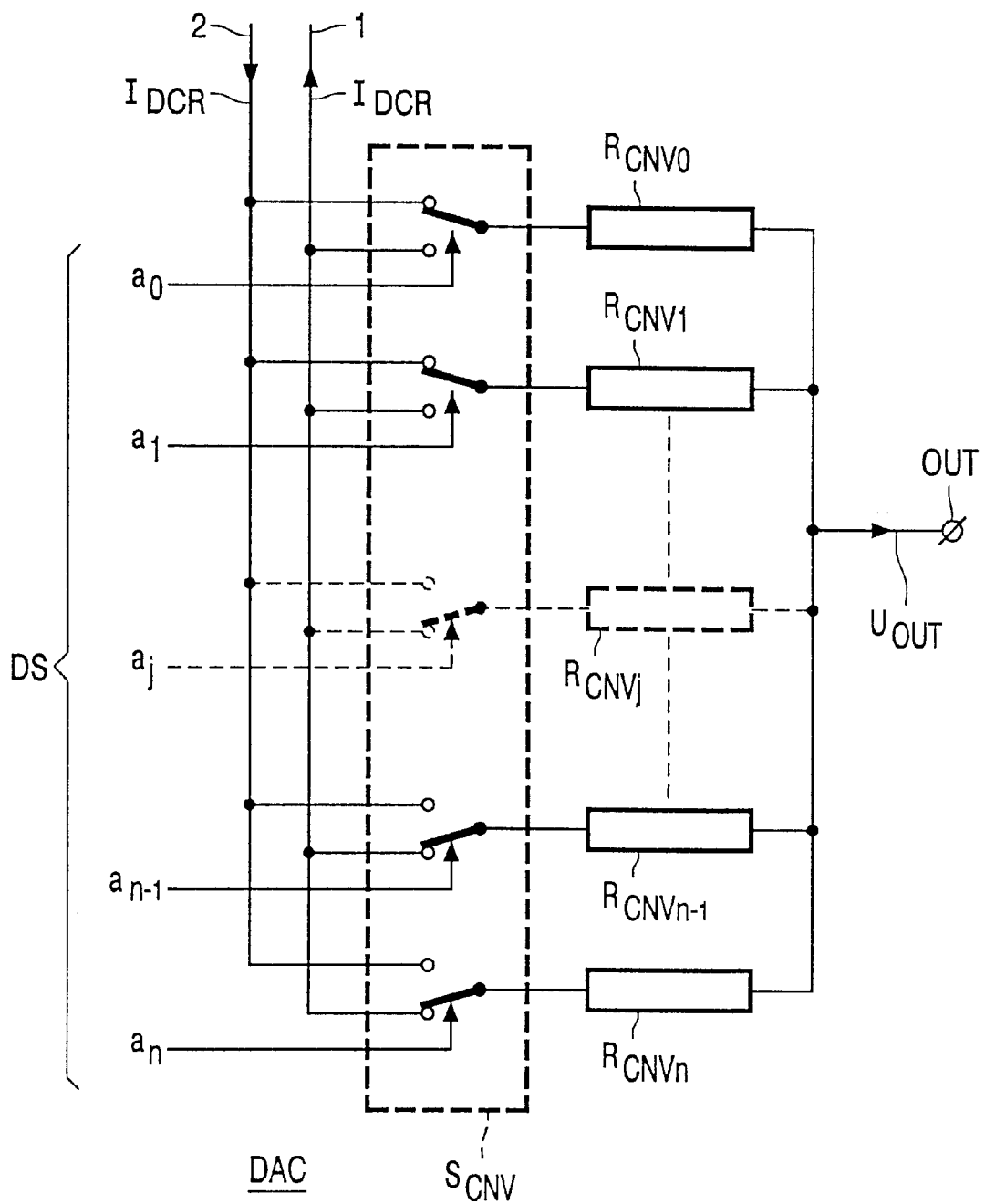
FIG. 5 is a circuit diagram of an embodiment of a DA converter for use in the electronic circuit of FIG. 2.

Instead of a current compensation circuit CMP with resistors as shown in FIG. 4, a current compensation circuit CMP may alternatively be used comprising current sources as indicated in FIG. 3. FIG. 3 shows by way of example three compensation current sources $I_{CMP1}$ to $I_{CMP3}$ which are connected between the first supply connection point 1 and the second supply connection point 2. The compensation current sources supply a certain reference current, or one or several compensation current sources are switched off, in dependence on the data content of the digital signal DS.

As an alternative to the current compensation circuit CMP as shown in FIG. 3, it is possible not to make the number of switched-on compensation current sources $I_{CMP1}$–$I_{CMP3}$ dependent on the data content of the digital signal DS, but to switch on only one of the compensation current sources $I_{CMP1}$–$I_{CMP3}$ at any time, the value of the current supplied by the one switched-on compensation current source $I_{CMP1}$–$I_{CMP3}$ being dependent on the data content of the digital signal DS.

As an alternative to the current compensation circuit CMP as shown in FIG. 4, it is also possible not to make the number of compensation resistors $R_{CMP1}$–$R_{CMP3}$ connected between the first supply connection point 1 and the second supply connection point 2 dependent on the data content of the digital signal DS, but to connect only one of the compensation resistors $R_{CMP1}$–$R_{CMP3}$ between the first supply connection point 1 and the second supply connection point 2 at any time, the value of said one compensation resistor $R_{CMP1}$–$R_{CMP3}$ being dependent on the data content of the digital signal DS.

The electronic circuit may be built up from discrete components or be implemented in an integrated circuit. Transistors may be used for the compensation current sources, for example bipolar transistors or field effect transistors.

What is claimed is:

1. An electronic circuit comprising a data processing circuit (DCR) for processing a digital signal (DS), which data processing circuit (DCR) is coupled between a first supply connection terminal ($V_{SS}$) and a second supply connection terminal ($V_{DD}$) for receiving a supply voltage ($U_1$), characterized in that the electronic circuit comprises a current compensation circuit (CMP) which is coupled between the first supply connection terminal ($V_{SS}$) and the second supply connection terminal ($V_{DD}$) for receiving the supply voltage ($U_1$), which current compensation circuit CMP) in the operational state is controlled from the digital signal (DS) such that the sum of the current consumption ($I_{DCR}$) of the data processing circuit (DCR) and the current consumption ($I_{CMP}$) of the current compensation circuit (CMP) is substantially independent of the data content of the digital signal (DS).

2. An electronic circuit as claimed in claim 1, characterized in that the data processing circuit (DCR) is a DA converter (DAC) for converting the digital signal (DS) into an analog signal ($U_{OUT}$).

3. An electronic circuit as claimed in claim 2, characterized in that the current compensation circuit (CMP) comprises compensation current sources ($I_{CMP1}$–$I_{CMP3}$) which are coupled between the first supply connection terminal ($V_{SS}$) and the second supply connection terminal ($V_{DD}$), a number of said compensation current sources ($I_{CMP3}$) being switched on in the operational state, said number being dependent on the data content of the digital signal (DS).

4. An electronic circuit as claimed in claim 2, characterized in that the current compensation circuit (CMP) comprises compensation resistors ($R_{CMP1}$–$R_{CMP3}$), a number of said compensation resistors ($R_{CMP3}$) being coupled between the first supply connection terminal ($V_{SS}$) and the second supply connection terminal ($V_{DD}$) in the operational state, said number being dependent on the data content of the digital signal (DS).

5. An electronic circuit as claimed in claim 2, characterized in that the current compensation circuit (CMP) comprises compensation current sources ($I_{CMP1}$–$I_{CMP3}$) which are coupled between the first supply connection terminal ($V_{SS}$) and the second supply connection terminal ($V_{DD}$), one of said compensation current sources ($I_{CMP1}$–$I_{CMP3}$) being switched on in the operational state, the value of the current supplied by said switched-on current sources ($I_{CMP1}$–$I_{CMP3}$) being dependent on the data content of the digital signal (DS).

6. An electronic circuit as claimed in claim 2, characterized in that the current compensation circuit (CMP) comprises compensation resistors ($R_{CMP1}$–$R_{CMP3}$), one of said compensation resistors ($R_{CMP1}$–$R_{CMP3}$) being coupled between the first supply connection terminal ($V_{SS}$) and the second supply connection terminal ($V_{DD}$) in the operational state, the value of said one compensation resistor ($R_{CMP1}$–$R_{CMP3}$) being dependent on the data content of the digital signal (DS).

7. An electronic circuit as claimed in claim 2, characterized in that the DA converter (DAC) comprises conversion resistors ($R_{CNV0}$–$R_{CNVn}$), a number of said conversion resistors ($R_{CNV2}$–$R_{CNVn}$) being coupled between the first supply connection terminal ($V_{SS}$) and an output terminal (OUT) of the DA converter (DAC) in the operational state, while the remaining number of conversion resistors ($R_{CNV0}$–$R_{CNV1}$) is coupled between the second supply connection terminal ($V_{DD}$) and the output terminal (OUT), said number being dependent on the data content of the digital signal (DS).

\* \* \* \* \*